United States Patent [19]

Ichinose et al.

[11] Patent Number: 4,937,097
[45] Date of Patent: Jun. 26, 1990

[54] APPARATUS FOR AND METHOD OF SCREEN PRINTING ON BOARDS

[75] Inventors: Shiro Ichinose, Nishinomiya; Kazuo Segawa, Kashihara; Kunio Katsuuma, Osaka; Hideo Ohta, Nara, all of Japan

[73] Assignees: Toshin Kogyo Co., Ltd., Amagasaki; Satosen Co., Ltd., Osaka, both of Japan

[21] Appl. No.: 272,594

[22] Filed: Nov. 17, 1988

[30] Foreign Application Priority Data

| Nov. 19, 1987 | [JP] | Japan | 62-293838 |
| Nov. 19, 1987 | [JP] | Japan | 62-293839 |
| Nov. 19, 1987 | [JP] | Japan | 62-293840 |
| Nov. 19, 1987 | [JP] | Japan | 62-293841 |
| Nov. 19, 1987 | [JP] | Japan | 62-293842 |
| Nov. 27, 1987 | [JP] | Japan | 62-300528 |
| Nov. 27, 1987 | [JP] | Japan | 300529 |
| Nov. 27, 1987 | [JP] | Japan | 62-181743 |
| Dec. 3, 1987 | [JP] | Japan | 62-184847 |

[51] Int. Cl.$^5$ .................. B05D 5/12; B05D 1/32; B05C 3/20
[52] U.S. Cl. .................. 427/96; 101/123; 101/129; 118/406; 427/210; 427/282
[58] Field of Search ................. 427/210, 96, 282; 118/213, 264, 406; 101/123, 129

[56] References Cited

U.S. PATENT DOCUMENTS

| 4,275,655 | 6/1981 | Artaud et al. | |
| 4,509,455 | 4/1985 | Shirataki | 101/123 X |
| 4,599,248 | 7/1986 | Shirataki | 427/209 |

OTHER PUBLICATIONS

Lapedes, D. N. (ed.), "McGraw-Hill Dictionary of Scientific and Technical Terms," New York, McGraw-Hill Book Company, 1976, p. 1341.

Primary Examiner—Evan Lawrence
Attorney, Agent, or Firm—Armstrong, Nikaido, Marmelstein, Kubovcik & Murray

[57] ABSTRACT

A screen printing apparatus and method for forming printed wiring on a board. The apparatus comprises a holder for holding the board upright in posiiton, and a printing device arranged vertically for at least one surface of the board as held in position by the holder, the printing device including a spatula-like squeegee, a screen, a first scraper in the form of a spatula for scraping ink from the front surface of the screen remote from the board and a second scraper in the form of a spatula for scraping ink from the rear surface of the screen adjacent the board, the first scraper and the second scraper being mechanically drivable at the same time to scrape the screen with the first scraper positioned below or above or at the same level as the second scraper, the squeegee being mechanically drivable for squeegeeing ink on the front surface of the screen after the first and second scrapers scrape the screen.

23 Claims, 7 Drawing Sheets

APPARATUS FOR AND METHOD OF SCREEN PRINTING ON BOARDS

The present invention relates to an apparatus for and a method of screen printing on boards, and more particularly to screen printing apparatus and method for coating or marking such boards with a resist or with patterns or symbols by squeegeeing with use of mechanical drive means. The term "screen printing" is used herein and in the appended claims in a broad sense of the term including coating the entire surface of a screen with a resist.

Screen printing on boards is already known. With screen printing machines heretofore used for this purpose, the screen is cleaned by the operator. When the screen is cleaned by the operator, satisfactory prints are not always available even if done continually since the screen can not be manually cleaned uniformly every time in the degree of cleaning. Variations in the degree of cleaning appear as irregularities in the deposit of ink on the print.

The conventional screen printing machines used are of the type wherein the screen is positioned horizontally, and the printing means including the screen and a squeegee is provided only on the upper side of the board to be printed. When the board is to be printed on both surfaces thereof by the machine, each surface must be printed separately. This method of printing is likely to produce a difference in the result achieved between the front and rear surfaces and is therefore undesirable.

The problem encountered with the prior art will not be overcome even if the two surfaces are printed at the same time with the printing means provided also on the lower side of the board. On the upper screen, the ink is subjected to the action of gravity toward the screen, while the ink on the lower side is similarly acted on in a direction away from the screen. This creates a difference in the degree of penetration of the ink between the upper screen and the lower screen, rendering the machine unable to assure the same result on both surfaces.

Thus, a fully mechanized screen printing machine still remains to be developed which is adapted to print boards for printed wiring with the same result on both surfaces thereof.

An object of the present invention is to provide a mechanized screen printing apparatus and method for preparing printed wiring boards, as adapted to satisfactorily print or coat a multiplicity of such boards free of variations from board to board.

Another object of the invention is to provide a screen printing apparatus and method for preparing printed wiring boards, as adapted to print or coat both surfaces of the board with equivalent results.

To fulfill these and other objects, the present invention provides a screen printing apparatus for forming printed wiring on a board comprising means for holding the board upright in position, and printing means arranged vertically for at least one surface of the board as held in position by the holding means, the printing means including a spatula-like squeegee, a screen, a first scraper in the form of a spatula for scraping the front surface of the screen and a second scraper in the form of a spatula for scraping the rear surface of the screen, the first scraper and the second scraper being mechanically drivable at the same time to scrape the screen with the first scraper positioned below or above or at the same level as the second scraper, the squeegee being mechanically drivable for squeegeeing after the first and second scrapers scrape the screen.

When the screen is to be scraped by the first and second scrapers at the same time with the former position below the latter, the second scraper first cleans the rear surface of the screen, ink is then supplied to the front surface of the screen, and the first scraper is thereafter moved over the front surface to uniformly fill the ink into the meshes and cause a small amount of the ink to seep through the screen to the rear surface. Accordingly, the ink on the front and rear surfaces is prevented from drying to diminish the variation in the viscosity of ink on the screen. A multiplicity of boards for printed wiring can therefore be printed or coated uniformly by the screen printing apparatus with use of the mechanically driven squeegee.

The mode of screen printing wherein the first and second scrapers are caused to scrape the screen at the same time with the former positioned below the latter is especially suitable for coating the entire surface of the board, for example, with a photoresist.

Generally, the first scraper is positioned about 10 to about 200 mm, preferably about 70 to about 120 mm, below the second scraper. When the spacing is generally in this range, the screen can be scraped by the two scrapers while being given a degree of cushioning property, whereby the ink can be filled in with the first scraper effectively. When effectively filling in the screen meshes and seeping through the screen to its rear surface, the ink is deposited, by squeegeeing, i.e. printing or coating, on the surface of the board to be printed to form an ink layer or coating having a sufficient thickness as required. Preferably, the first and second scrapers have such properties that they will not be bent by being pressed into contact with the screen. The screen can then be scraped by the scrapers with an improved result while being given the above-mentioned cushioning property.

When the screen is to be scraped by the first and second scrapers at the same time with the former positioned above the latter, the ink is filled into the screen meshes by the first scraper on the screen front surface, and the second scraper removes an excess of the ink forced out on the screen rear surface by the filling operation. Accordingly, the ink can be applied to sufficient thickness as required, permitting the squeegee to form a sharp image by printing. Moreover, a multiplicity of boards can be thus printed uniformly.

The mode of screen printing wherein the first and second scrapers are caused to scrape the screen at the same time with the former positioned above the latter is especially suitable for printing patterns.

Generally, the first scraper is positioned about 10 to about 200 mm, preferably about 70 to about 120 mm, above the second scraper. When the spacing is generally in this range, the screen can be scraped by the two scrapers while being given a degree of cushioning property, whereby the excessive ink can be removed from the rear surface by the second scraper effectively. Preferably, the first and second scrapers have such properties that they will not be bent by being pressed into contact with the screen. The screen can then be scraped by the scrapers with an improved result while being given the cushioning property.

When the screen is to be scraped by the first and second scrapers at the same time which are positioned at the same level, the ink is filled into the screen meshes by the first scraper from the screen front surface, and the second scraper wipes off an excess of the ink from the screen rear surface. Consequently, a multiplicity of boards can be printed or coated all uniformly. Further even when the squeegee is moved once, a satisfactory print or coating can be obtained.

The mode of screen printing wherein the first and second scrapers are used as positioned at the same level for simultaneous scraping is suitable for coating or masking a resist on substrates and printing patterns and symbols alike.

In any of the first, second and third modes of screen printing, it is desired that the squeegee be about 6 to about 10 mm in thickness, be projected from the support plate therefor by a length of about 20 to about 40 mm, have a Shore hardness (HS) of about 60 to about 90 HS, and be used under a pressure of about 300 to about 1500 $g/cm^2$ and at an angle (squeegeeing angle) of about 60 to about 90 degrees relative to the surface of the board to be printed. Even when the board surface to be printed or coated has through holes or cavities or like minute surface irregularities, the squeegee is usable without creating faults, such as blank spots free of deposition of ink and produced by the stepped portions of such irregularities along the squeegeeing direction and shadows at corners of projections.

When the printing means of the invention is disposed on each of opposite surfaces of the board, the ink penetrates into the screens on both sides to the same degree since the printing means is of the upright type. Accordingly, the board can be printed or coated at the same time on both surfaces thereof with the same result by the printing means arranged on both sides.

According to the present invention, the squeegee and the first scraper may be arranged, with the squeegee positioned slightly above or below the first scraper, and moved together upward and downward for the operation of the squeegee during the movement in one direction and for the first and second scrapers to scrape the screen during movement in the other direction. In this case, the first and second scrapers are positioned away from the screen during squeegee, and the squeegee is held away from the screen during scraping. During the downward movement of the squeegee and the scraper, the lower of these members is held at a distance of about 1 mm away from the screen front surface to a position where the member is in contact with the front surface without exerting any substantial pressure thereon. When positioned in this range, the scraper or the squeegee at the lower level serves to prevent the ink from flowing down the vertical screen. If the clearance is not greater than about 1 mm, the ink which is viscous will not flow down through the clearance. When thus prevented from flowing down, the ink will not be wasted or will not soil the neighboring articles or machine parts.

According to the present invention, the squeegee may be used for squeegeeing with its axis positioned obliquely with respect to the direction of advance of the squeegee. This mode of squeegeeing results in the following.

The board surface to be printed or coated is likely to have indentations, for example, owing to etching for forming a circuit. Such indentations always include those positioned as substantially distributed in the direction of advance of the squeegee and having a depth of tens of micrometers. If the squeegee is mechanically driven with its axis positioned perpendicular to the direction of advance of the squeegee in the usual manner for a board having these indentations, the squeegee passes over the indented stepped portions in line contact therewith and therefore vibrates, producing wavelike variations in density on the printed or coated surface.

This problem can be obviated by oblique squeegeeing. When obliquely positioned, the squeegee comes into point contact with the indented stepped portions (strictly stated, with the screen interposed therebetween), and the position of point contact continuously shifts owing to the oblique orientation when the squeegee passes over the stepped portion. For this reason, the squeegee operates smoothly free of vibration.

In the oblique squeegeeing, the acute angle between the axis of the squeegee and the direction of advance is greater than about 80 degrees. If the angle is smaller, the ink flows as deflected toward one side of the squeegee along the oblique axis of the squeegee, consequently producing density irregularities on the printed or coated surface with respect to the lengthwise direction of the squeegee. This problem can be overcome when the angle is greater than about 80 degrees.

The present invention will be described below in greater detail with reference to the accompanying drawings, in which.

Throughout the drawings, like parts are designated by like reference numerals.

Figure 3:
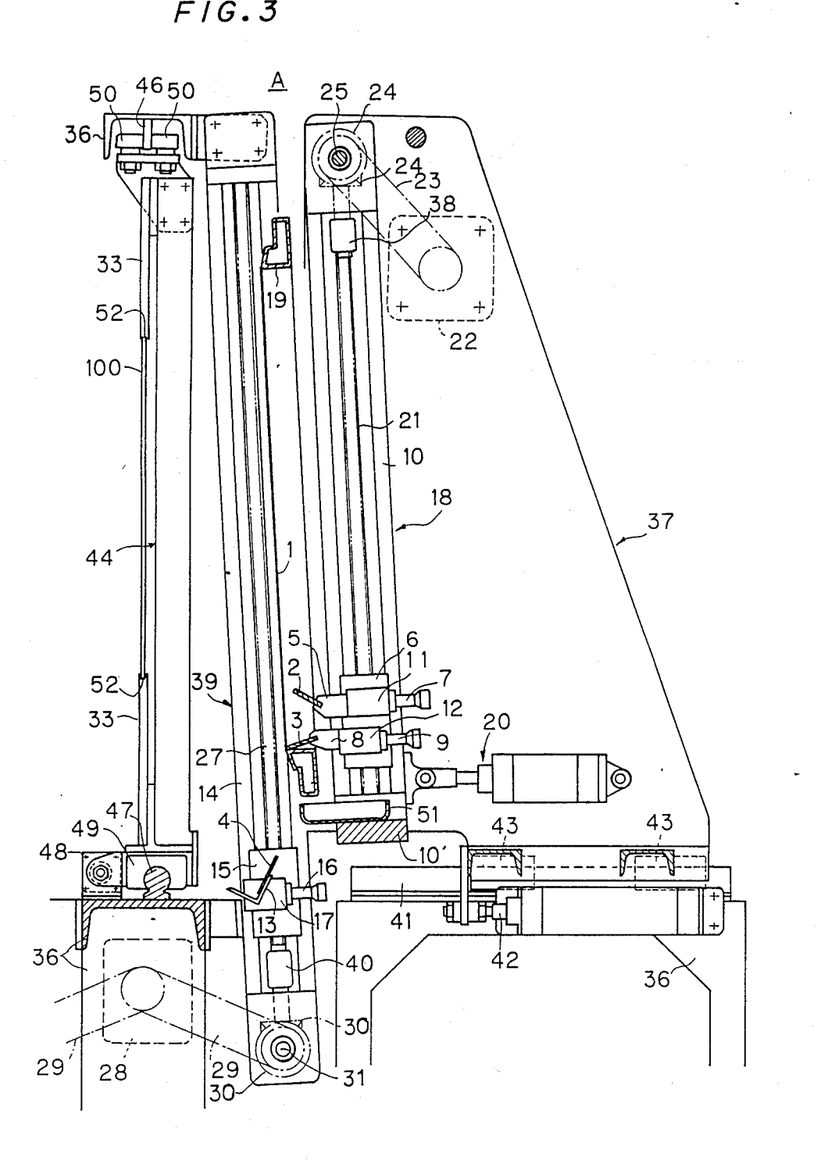
FIG. 3 is an enlarged view showing printing means included in the apparatus of FIG. 1.

The illustrated screen printing apparatus or machine for preparing printed circuit boards comprises means 33 for holding a board 100 upright in position, and printing means disposed upright for each surface of the board 100 held in position by the holding means 33. The printing means, which is best shown in FIG. 3, is designated collectively by the character A. FIG. 3 shows the printing means A for only the right side of the board 100. The printing means A comprises a screen 1, a squeegee 2, a first scraper 3 positioned slightly below the squeegee 2 for scraping the front surface (opposed to the squeegee 2) of the screen 1, and a second scraper 4 for scraping the rear surface (opposed to the board 100) of the screen 1.

The squeegee 2 is secured at its base portion by a support plate 5 of metal or the like which is a kind of jig.

The support plate 5 for the squeegee 2 is mounted at its opposite ends on carriers 6, 6 slidable on a pair of guide members 10, 10 extending upright. The support plate 5 is movable forward or rearward (laterally in FIGS. 2 and 3) by adjusting screws 7, whereby the squeegeeing pressure of the squeegee 2 is adjustable. Aside from the forward or rearward movement by the adjusting screw 7, the support plate 5 is further shiftable by solenoids 11 between two positions, i.e., a position where the squeegee 2 is pressed into contact with the surface of the screen 1 and a position away from the screen rightward in FIG. 3.

Like the squeegee 2, the first scraper 3 resembles a spatula, is similar to the squeegee 2 in basic construction, and has a support plate 8 which is attached at its opposite ends to the carriers 6, 6. Indicated at 9 are adjusting screws for moving the support plate 8 forward or rearward to thereby adjust the degree of pressing contact of the scraper 3 with the screen surface. The scraper 3 is also shiftable between two positions, i.e., a position where the scraper is in pressing contact with the screen surface and a position away from the screen rightward of FIG. 3. Indicated at 12 are solenoids for shifting the scraper 3 between these two positions. The scraper 3 has such properties that it will not be bent by the pressing contact with the screen 1. For example, it is made of a metal plate or synthetic resin plate having sufficient rigidity or hardness.

Like the squeegee 2, the second scraper 4 also resembles a spatula. The scraper 4 is secured to a support plate 13, which in turn is attached at its opposite ends to carriers 15, 15 slidable on a pair of upright guide members 14, 14. By means similar to those already described for the squeegee, the scraper 4 is also adjustable in the degree of pressing contact with the rear surface of the screen 1 and shiftable between two positions, i.e., a position where it is in pressing contact with the screen rear surface and a position away from the screen leftward in FIG. 3. Indicated at 16 are screws for adjusting the degree of pressing contact, and at 17 solenoids for shifting the scraper between the two positions. The scraper 4 has such properties that it will not be bent by the pressing contact with the screen 1. For example, it is made of a metal plate or synthetic resin plate having such rigidity or hardness.

The guide members 10, 10 are combined with a cross member 10' to make a frame 18 carrying a bracket 34. The frame 18 has an ink tray 51 at its lower portion. A support frame 19 with the screen 1 extending thereover is secured to the bracket 34. The bracket 34 is adjustable in position laterally in FIG. 2 by adjusting screws 35 (see FIG. 1), whereby the clearance between the screen 1 and the surface of the board 100 is adjustable for squeegeeing. The frame 18 is suspended at its upper side from a frame structure 37 mounted on the base 36 of the screen printing machine and is pivotally movable laterally in FIGS. 2 and 3 about the axis of the shaft 25 to be described later. The frame 18 is so movable by an air cylinder-plunger unit 20. The unit 20 has one end pivoted to the lower portion of the frame 18 and the other end pivoted to the frame structure 37. The frame structure 37 is slidable by an air cylinder-plunger unit 42 on guide rails 41 installed on the base 36 and extending laterally in FIGS. 2 and 3. Indicated at 43 are slide shoes for the frame structure 37.

Each of the carriers 6, 6 is mounted by a ball thread 38 on a feed screw 21 provided on the guide member 10 and extending therealong. The feed screws 21, 21 are driven in synchronism by the forward or reverse rotation of a motor 22 mounted on the frame structure 37 on the base, through a transmission chain or timing belt 23, transmission gear 24, coupling shaft 25 and transmission gear 26, whereby the carriers 6, 6 are moved upward or downward in synchronism.

The guide members 14, 14 are fixed to the base 36 in a specified position and combined with the base 36 to form a frame 39. The frame 39 is so sized as to permit the frame 18 to pass therethrough.

Each carrier 15 is mounted by a ball thread 40 on a feed screw 27 mounted on and extending along the guide member 14. The feed screws 27, 27 are driven in synchronism by the forward or reverse rotation of a motor 28 by way of a transmission chain or timing belt 29, transmission gear 30, coupling shaft 31 and transmission gear 32, whereby the carriers 15, 15 are moved upward or downward in synchronism.

The motors 22 and 28 are rotatable at the same speed. The carriers 6, 6 are adapted to advance at the same speed as the carriers 15, 15.

Figure 1:
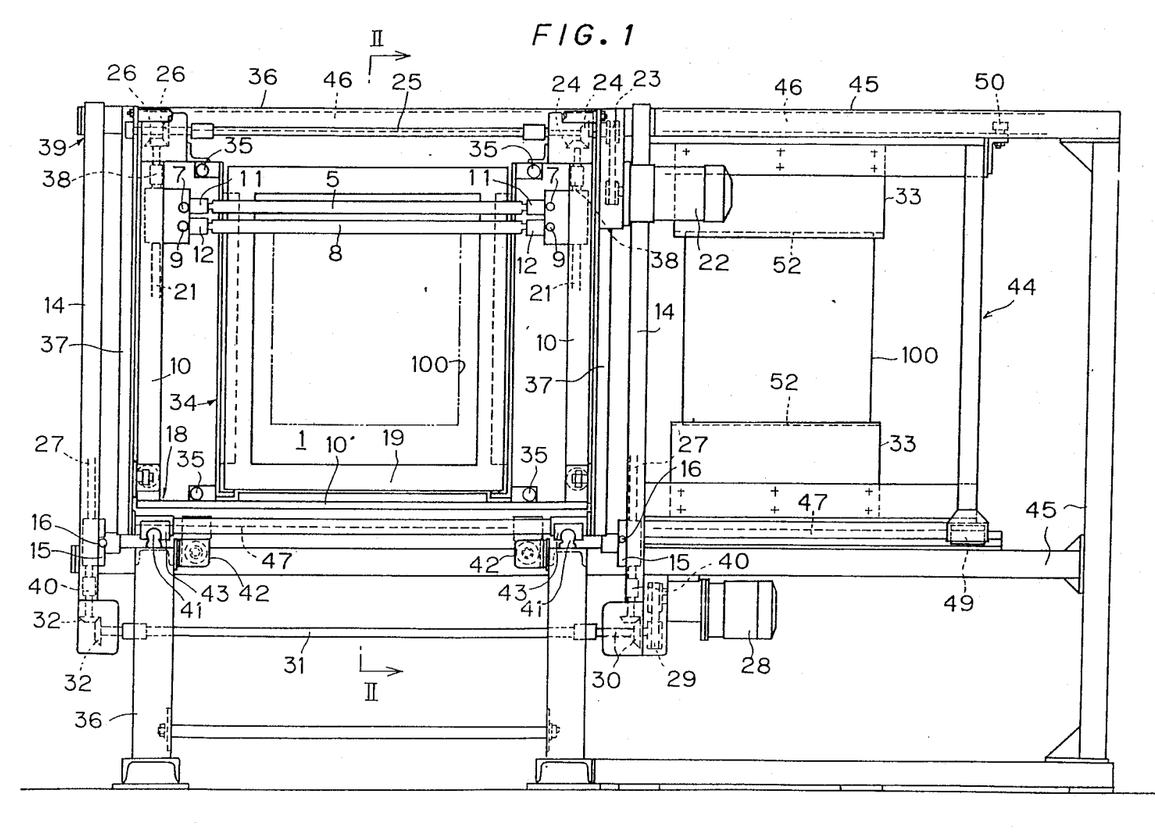
FIG. 1 is a front view showing an apparatus embodying the invention.

The screen printing machine further includes a frame 44 provided for the board 100 and having vertically opposed holders 33, 33. The frame 44 is slidable by an air cylinder-plunger unit 48 on upper and lower guide rails 46, 47 extending in parallel horizontally laterally of FIG. 1. These guide rails 46, 47 are mounted in position on the assembly of the base 36 and another base 45 adjacent thereto. Indicated at 49 is a slide shoe for the frame 44, and at 50 a roller on the frame 44. The left end of the frame 44, and the slide shoe and the roller at this end are not shown in FIG. 1 to simplify the drawing for a better understanding. However, the shoe and roller are arranged substantially symmetrically with those provided at the right end as shown in FIG. 1.

The board 100 is supported between the holders 33 and 33 on the frame 44 mounted on the base 45. Grooves 52, 52 are formed in the respective holders 33, 33 for inserting the opposite ends of the board 100 therein. The board 100 supported is brought from the solid-line position to the phantom-line position in FIG. 1 by the movement of the frame 44 by the air cylinder-plunger unit 48.

Prior to the transport of the board 100, ink for coating or marking the board with a resist, pattern or symbols is applied to the surface of the screen by the following procedure.

The frame structure 37 is brought to a standby position (FIG. 3) to thereby cause the frame 18 and the screen 1 to wait in position. Further the assembly of the squeegee 2 and the first scraper 3 is brought to a standby position (FIG. 3) on the frame 18, and the second scraper 4 is caused to wait in position (FIG. 3) on the frame 39. With the parts thus in standby state, the squeegee 2 is positioned away from the surface of the screen 1, the first scraper 3 is lightly in pressing contact with the screen surface, and the second scraper 4 is slightly rearwardly (toward the center of the machine) away from the plane of the screen rear surface.

A suitable amount of ink is supplied to the upper side of the forward end of the first scraper 3 in the standby state by a suitable method.

On the other hand, the motor 28 is driven to raise the second scraper 4. When the second scraper rises to a level about 10 to about 200 mm, preferably about 70 to about 120 mm, below the first scraper 3 in the standby position, or to the same level as the first scraper 3, or to a level about 10 to about 200 mm, preferably about 70 to about 120 mm, above the scraper 3, the motor 22 is driven to raise the first scraper 3 and the squeegee 2 while allowing the second scraper 4 to continue rising. During this movement, the squeegee 2 is held away from the screen, and the first scraper 3 is held in light pressing contact with the screen surface. Upon the second scraper 4 reaching the selected level relative to the first scraper 3, the scraper 4 is shifted into light pressing contact with the screen rear surface and thereafter held in this pressing contact position until the assembly of the squeegee 2 and the first scraper 3 rises to a specified position.

In this way, both surfaces of the screen 1 are scraped at the same time by the scrapers 3 and 4 as positioned at the same level or with the former positioned the specified distance below or above the latter.

Thus, the ink is applied to the surface of the screen 1, and the screen rear surface is cleaned.

Upon the squeegee 2 and the first scraper 3 rising to the specified position, the motor 22 is deenergized to stop the squeegee 2 and the first scraper 3. The second scraper 4 thereafter still continues its upward movement to reach a level slightly above the stopped position of the first scraper 3. During the continued upward movement, the second scraper 4 is held away from the screen rear surface. Upon the second scraper 4 reaching the specified level, the motor 28 is reversely driven to lower the scraper 4 as held away from the screen rear surface to the original standby position. The squeegee 2 and the first scraper 3 remain in their stopped position.

When the ink has been applied to the screen 1, the board 100 is brought to a specified position and printed or coated by the squeegee 2 as will be described below.

The frame structure 37 is moved leftward in FIG. 3 by the air cylinder-plunger unit 42 to advance the frame 18 along with the screen 1 to the specified position. (This step will be referred to as "step F".) The screen 1 and the frame 18 are thereafter pivotally moved by the air cylinder-plunger unit 20 toward the board 100 to a position immediately in front of the board surface to be printed. At a suitable time before the screen 1 is brought to this position, the first scraper 3 is shifted to a position away from the screen 1. (This shift of the scraper 3 will be referred to as "R shift".)

After the completion of the pivotal movement of the screen 1 and the frame 18, the squeegee 2 is pressed against the front surface of the board 100 with the screen 1 interposed therebetween. In this state, the carriers 6, 6 are lowered to operate the squeegee 2 for squeegeeing. Consequently, the board 100 is coated or marked with a resist, or with a pattern or symbols.

On completion of the squeegeeing, the screen 1 and the frame 18 are returned to the original specified or standby position by the return of the frame structure 37 to its original position. On the other hand, the squeegee 2 is shifted to the position away from the screen 1. The first scraper 3 is brought into light pressing contact with the screen surface again.

The printed or coated board 100 is returned to the position where it was initially set in the machine, and is removed from the holder 33, 33.

The step F and the following steps are thereafter repeated again except for the R shift. In the second and following printing or coating cycles, the ink is applied to the screen prior to squeegeeing and a new board is transported to the specified position in the same manner as already described.

The assembly of the squeegee 2 and the first scraper 3, the second scraper 4, the screen 1 and the frame 18 are controlled in sequence for the required movement or operation using sensors, limit switches or like suitable means for detecting these components as brought to predetermined positions during the operation. When required, timers are also usable for this purpose. These detecting means and sequence control will be apparent to one skilled in the art and are therefore not shown.

Figure 4:
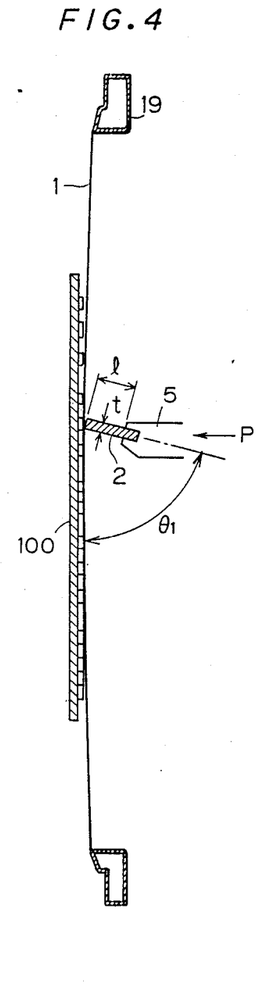
FIG. 4 is a view illustrating a squeegee as to the thickness thereof, length of projection of the same from a support plate therefor, squeegeeing pressure and squeegeeing angle.

Preferably, the squeegee 2 for use in the foregoing screen printing or coating operation is about 6 to about 10 mm in thickness t, about 20 to about 40 mm in the length l of projection from the support plate 5 and about 60 to about 90 HS in hardness and is used at a squeegeeing pressure P of about 300 to about 1500 $g/cm^2$, more preferably about 700 to about 1000 $g/cm^2$ and at a squeegeeing angle $\theta_1$ of about 60 to about 90 degrees. (See FIG. 4 for t, l, P and $\theta_1$.)

Figure 2:
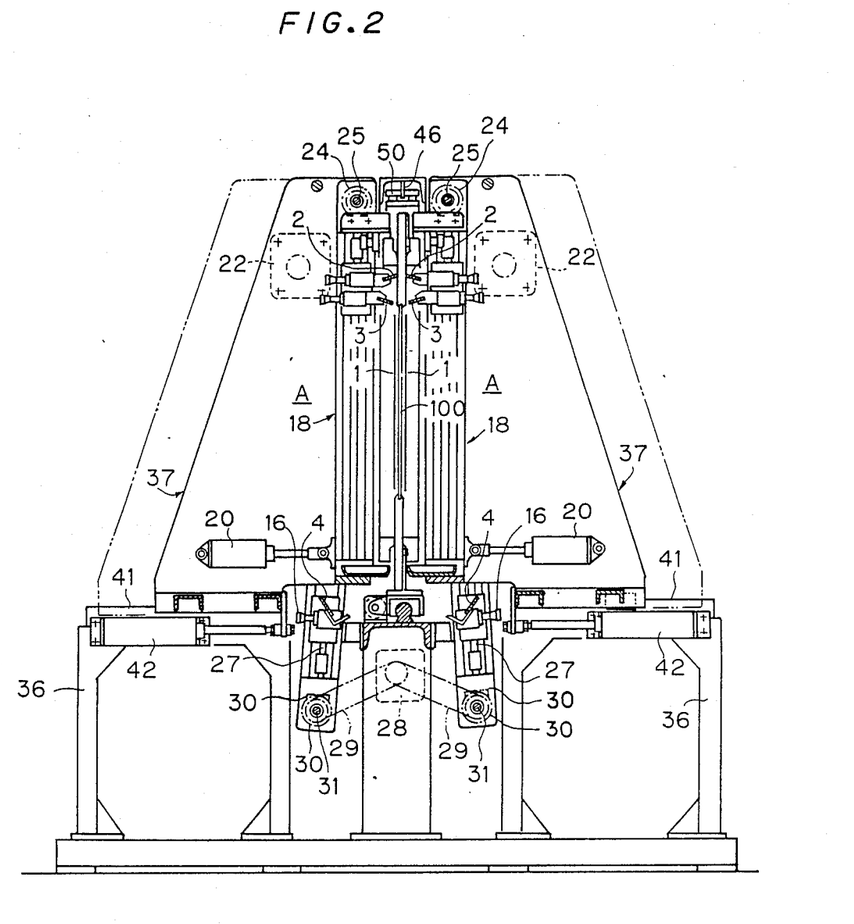
FIG. 2 is a view in section taken along the line II—II in FIG. 1.
Figure 5:
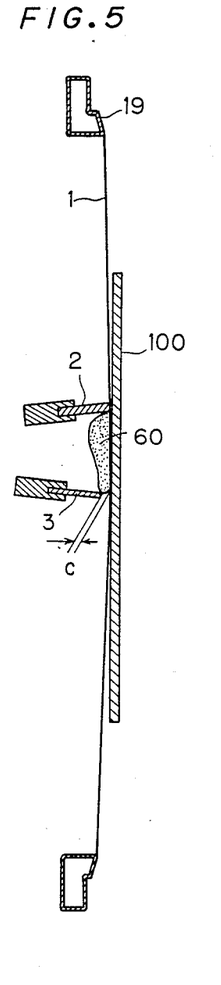
FIG. 5 is an illustration showing ink as prevented from flowing down a screen by a first scraper.
Figure 6:
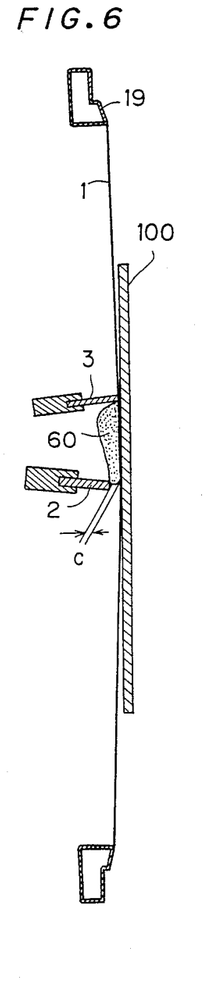
FIG. 6 is an illustration showing ink as prevented from flowing down the screen by the squeegee.

With the embodiment of FIGS. 1 to 3, the first scraper 3 may be positioned a small distance, preferably about 30 to about 120 mm, above the squeegee 2 during the descent of the squeegee 2 or during the squeegeeing step (accordingly, with the first scraper 3 out of scraping contact with the screen) while being located within a range C from a position about 1 mm away from the screen surface to a position where the scraper 3 is substantially out of scraping contact with the screen surface. The scraper 3 then prevents the ink 60 from flowing down the screen 1 (see FIG. 5). Alternatively, the squeegee 2 may be disposed a small distance, preferably about 30 to about 120 mm, above the scraper 3 and located within the same range C as above relative to the screen 1, with the scraper 3 in scraping contact with the screen 1 during the descent of the squeegee 2 and the scraper 3. This modification is schematically shown in FIG. 6. The modification of FIG. 6 is substantially identical with the embodiment of FIGS. 1 to 3 in construction except that the squeegee 2 and the scraper 3 of the modification are arranged in reverse relation to those of the embodiment. With the modification of FIG. 6, the squeegee 2 is operated for squeegeeing during the upward movement. Thus, while the assembly of the squeegee 2 and the scraper 3 moves upward and downward, the squeegeeing step is performed during the upward movement, and the scraper 3 scrapes the screen during the downward movement.

Figure 7:
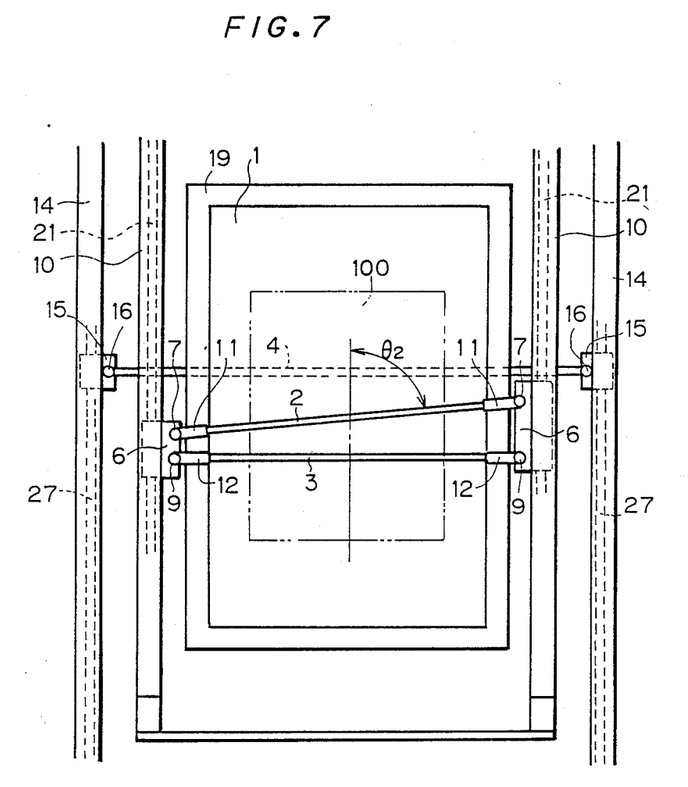
FIG. 7 is a front view for illustrating the principle of the present apparatus wherein the squeegee is positioned obliquely.

In either of the arrangements of FIGS. 1 to 3 and FIG. 6, the squeegee 2 may be operated for squeegeeing with its longitudinal axis positioned obliquely with respect to the direction of advance of the squeegee (FIG. 7). In this case, the acute angle $\theta_2$ between the axis and the direction of advance of the squeegee 2 is greater than about 80 degrees and is generally about 80 to about 89 degrees. The modification of FIG. 7 is substantially identical with the embodiment of FIGS. 1 to 3 in construction except that the squeegee 2 is disposed obliquely.

Figure 8:
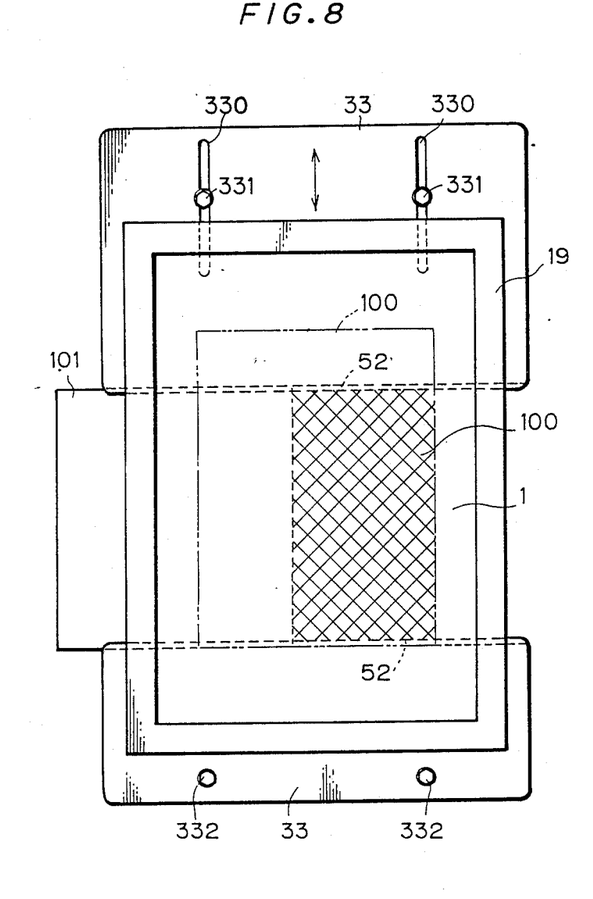
FIG. 8 is a front view showing modified means for holding a board for printed wiring.
Figure 9:
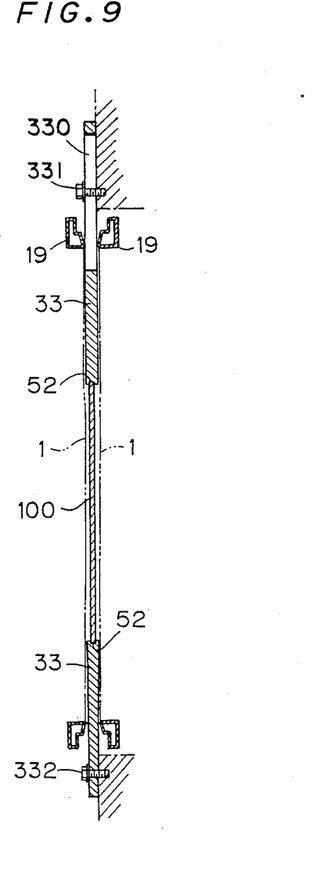
FIG. 9 is a side elevation of the holding means shown in FIG. 8.

The board 100 which is held by the means described with reference to FIGS. 1 to 3 can alternatively be held by modified means as seen in FIGS. 8 and 9. According to the modification, the screen 1 and the holders 33, 33 are sized to correspond to the greatest printing or squeegeeing size available with the screen printing machine. At least one of the holders 33, 33 is vertically adjustable in its installed position. Preferably, the holders 33, 33 are each in the form of a plate having a slightly larger thickness than the board 100. With the arrangement shown in FIGS. 8 and 9, the upper holder only is adjustable. The adjustable holder has vertical slots 330 and is fastened in place with bolts 331 inserted through the respective slots 330. Indicated at 332 are fastening bolts for the stationary holder. The embodiment of FIGS. 8 and 9 has substantially the same construction as the one shown in FIGS. 1 to 3 except for the modified board holding means.

For holding a particular board 100, the adjustable holder is adjusted in position in conformity with the vertical dimension of the board. Thus, the opposed holders 33, 33 serve to hold boards ranging from a maximum size to a minimum size. FIG. 8 shows the holders 33, 33 as used for holding a board of minimum size, which is represented by the area marked with crisscross lines. A board of maximum size is indicated in a dot-and-dash line. The difference of a board of small size from the maximum squeegeeing size in horizontal dimension is compensated for by a dummy board 101 inserted between the holders 33, 33. The dummy board 101 has the same thickness as the board 100. The dummy board may be slidable for insertion.

The screen printing machine equipped with the modified holding means is suitable for coating boards with a resist over the entire surface thereof. The modification assures that a screen sized to correspond to the maximum squeegeeing size available is usable for boards of varying sizes smaller than the maximum size for coating the board with a resist over the entire surface thereof without impairing the releasability of the screen from the board. If a screen of large size is used as it is for printing boards of smaller size, the screen is not releasable from the board smoothly to impair the quality of the print obtained. It is well known to one skilled in the art that screens of varying sizes are available for use in printing boards of different sizes in corresponding relation thereto.

For use with thin boards which are, for example, about 0.2 to about 1.0 mm, more generally about 0.3 to about 0.6 mm, in thickness, the modified holding means to be described below is more desirable than the other holding means.

Each of two holding means, disposed one above the other, comprises a first clamp member in the form of a thin plate, and a second clamp member in the form of a thin plate and lapped over and joined to the first clamp member. The first and second clamp members clamp the end of the board therebetween. One of the holding means is stationary, while the other holding means can be pulled vertically by a device such as an air cylinder-plunger unit. The second clamp member is flexible at least at its forward end portion, which is openable relative to the first clamp member. An adhesive tape or adhesive is affixed or applied to at least one of the opposed inner surfaces of the forward end portions of the first and second clamp members, which are therefore separably adhered to each other.

Figure 10:
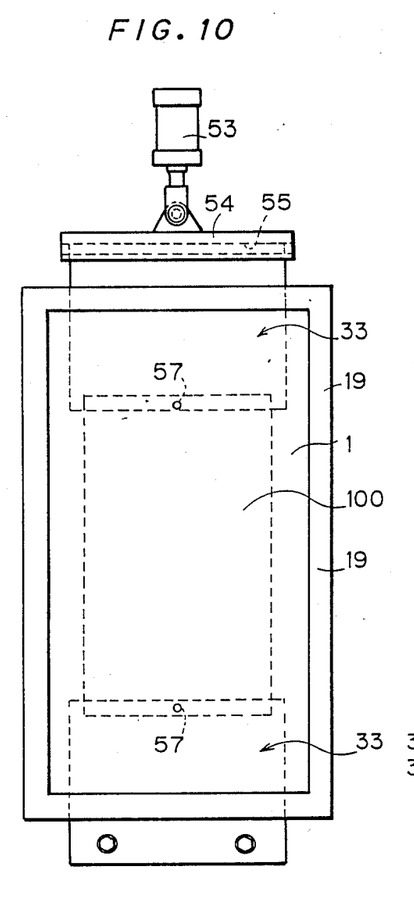
FIG. 10 is a front view showing another modified holding means.
Figures 11, 12:
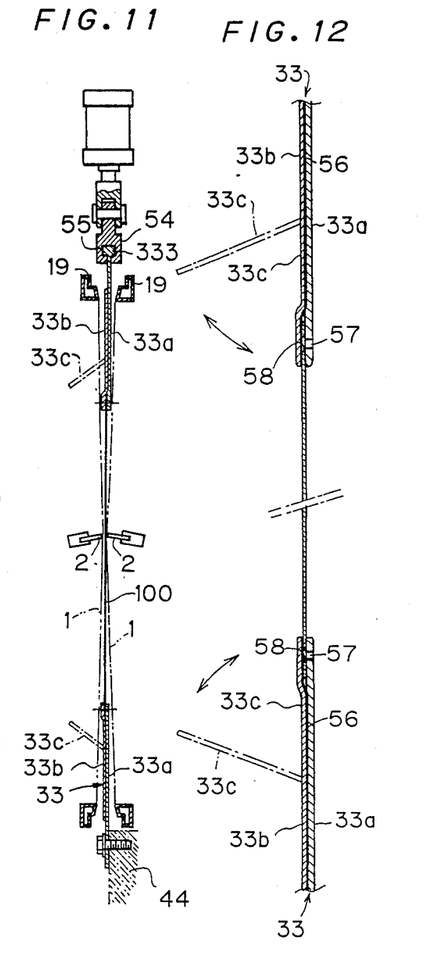
FIG. 11 is a side elevation showing the holding means of FIG. 10.
FIG. 12 is an enlarged fragmentary view of FIG. 11.

FIG. 10 to 12 show an example of such modified holding means. With reference to the illustrated modification, the upper holder 33 can be pulled vertically or upward by an air cylinder-plunger unit 53 which is fixed to the frame 44. The unit 53 has a horizontally extending connecting member 54 having a groove 55 which is constricted at its inlet. The upper holder, which can be pulled, has a horizontally extending enlarged base portion 333 which is inserted into the groove 55 of the member 54, whereby the holder can be connected to the unit 53 by the member 54. The first clamp member is indicated at 33a, the second clamp member at 33b, and the openable end portion of the second clamp member 33b at 33c. The adhesive tape or adhesive is indicated at 56. The first clamp members 33a, 33a have positioning pins 57, 57 for the ends of the board 100 to be held. The end faces of the pins 57 are flush with the plane of the board 100. The embodiment including the modification of FIGS. 10 to 12 has substantially the same construction as the embodiment of FIGS. 1 to 3 except for the modified holding means.

The board 100 is held by the holders 33, 33 shown in FIGS. 10 to 12 by the following procedure.

The forward end portions 33c, 33c of the second clamp members 33b, 33b of the upper and lower holders 33, 33 are opened, and the pins 57, 57 on the first clamp members 33a, 33a are fitted in pin holes 58, 58 formed in the upper and lower ends of the board 100, whereby the board 100 is supported by the holders 33, 33. The end portion 33c of each second clamp member 33b is then pressed against the inner surface of the first clamp member 33a at the corresponding end portion thereof to adhere the end portion 33c to the member 33a. Consequently, the upper and lower ends of the board 100 are clamped between the first and second clamp members 33a, 33b and 33a, 33b of the upper and lower holders 33, 33, respectively. The board 100 thus clamped is then tensioned by causing the air cylinder-plunger unit 53 to pull the upper holder 33.

The layer of adhesive 56 adhering the clamp member 33a to the end portion 33c exhibits high bond strength against the tensile force acting along the plane of the adhesive layer, i.e., in the direction of the tension, so that the board 100 can be subjected to a sufficient tensile load. Accordingly, the board 100, although thin, can be firmly held straight between the upper and lower holders 33 and 33 without loosening or bending. The board held free of loosening or bending permits the screen to be released from the board smoothly when it is to be separated therefrom.

The first and second clamp members 33a, 33b of each holder 33 which are joined together as lapped over each other are in the form of a thin plate. Each second clamp member 33b is flexible at least at its forward end portion 33c. There features have the following significance.

When the board as positioned upright is printed or coated on both surfaces thereof at the same time with the printing means arranged on each side thereof, it is actually necessary to move the squeegee over the board and further beyond the length thereof for squeegeeing. It is therefore required that the clamped portion of the thin board be free of projections to the greatest possible extent. This requirement can be fulfilled by the construction of the holder 33. Since the first and second clamp members 33a, 33b are lapped over each other and joined together in the form of a thin plate, the projection produced by the board end clamped between these members can be small and is allowable. Moreover, since at least the end portion 33c of the second clamp member 33b is flexible, the projection of the end portion 33c created by the clamped board end has no corner but is smoothly curved. This assures a smooth squeegeeing operation.

The board 100 can be removed from each holder 33 shown in FIGS. 10 to 12 by opening the end portion 33c from the second clamp member 33b and removing the pin 57 from the board 100.

It is likely that the board to be printed or coated is slightly curved or bent. If such a board is to be printed or coated on both surfaces thereof at the same time, it is desirable to clamp each of its upper and lower ends with a holder in the form of a plate and having such elasticity that the holder clamping the board will be bent under the squeegeeing pressure. It is also desired that the board have such elasticity. While the elasticity of the holder is variable over a wide range, the holder can generally be of such elasticity as afforded by a steel plate or stainless steel plate having a thickness of about 2 to about 2.5 mm in the case where the holder is about 200 to about 500 mm in the distance from its fixed portion, i.e., the bolted portion thereof, to the board end clamping portion. The elasticity of the board can be the elasticity of common boards per se which are widely used. Generally, the board can be of such elasticity as is afforded by a plate of fiber glass reinforced epoxy resin having a thickness of about 0.5 to about 1.5 mm.

The shape of platelike holders and the arrangement thereof are shown in FIGS. 1 to 3 and FIGS. 8 and 9.

When the holders holding the upper and lower ends of the board are platelike and further when the holders and the board so elastic as to be deformable by the squeegeeing pressure, these three members are combined to substantially exhibit the flexibility of a plate spring which serves to substantially equalize the squeegeeing pressures on both surfaces of the board even if the board is slightly curved. Consequently, the board can be printed or coated on both surfaces thereof equivalently. If a small difference occurs in the squeegeeing pressure between the squeegees on opposite sides for one cause or another, the flexibility absorbs the difference.

We claim:

1. A screen printing apparatus for forming printed wiring on a board comprising:
   means for holding the board upright in position, and printing means arranged vertically adjacent to at least one surface of the board as held in position by the holding means;
   the printing means including a spatula-like squeegee, a screen, a first scraper means in the form of a spatula for scraping ink from the front surface of the screen remote from said board and a second scraper means in the form of a spatula for scraping ink from the rear surface of the screen adjacent the board; and
   the first scraper means and the second scraper means being mechanically drivable at the same time to scrape the screen with the first scraper means positioned at a preset level with respect to the second scraper means, the squeegee being mechanically drivable for squeegeeing ink on the front surface of the screen after the first and second scraper means scrape the screen.

2. An apparatus as defined in claim 1 wherein the squeegee has a thickness of about 6 to about 10 mm, is projected from a support plate therefor by a length of about 20 to 40 mm, has a Shore hardness of about 60 to about 90 HS and a squeegeeing angle of about 60 to about 90 degrees with respect to the plane of the screen, and is set to a squeegeeing pressure of about 300 to 1500 g/cm$^2$.

3. A screen printing apparatus for forming printed wiring on a board comprising:
   means for holding the board upright in position, and printing means arranged vertically adjacent at least one surface of the board as held in position by the holding means;
   the printing means including a spatula-like squeegee, a screen, a first scraper means in the form of a spatula for scraping ink from the front surface of the screen remote from said board and a second scraper means in the form of a spatula for scraping ink from the rear surface of the screen adjacent said board;
   the squeegee having its longitudinal axis positioned obliquely with respect to the direction of advance of the squeegee, at an acute angle greater than about 80 degrees formed between the axis and the direction of advance of the squeegee;
   the first scraper means and the second scraper means being mechanically drivable at the same time to scrape the screen with the first scraper means positioned at a preset level with respect to the second scraper means; and
   the squeegee being mechanically drivable for squeegeeing ink on the front surface of the screen after the first and second scraper means scrape the screen.

4. An apparatus as defined in claim 3 wherein the squeegee has a thickness of about 6 to about 10 mm, is projected from a support plate therefor by a length of about 20 to about 40 mm, has a Shore hardness of about 60 to about 90 degrees HS and a squeegeeing angle of about 60 to about 90 degrees with respect to the plane of the screen and is set to a squeegeeing pressure of about 300 to about 1500 g/cm$^2$.

5. A screen printing apparatus for forming printed wiring on a board comprising:
   a pair of holding means vertically opposed to each other for holding the board upright, and printing means arranged vertically adjacent at least one surface of the board as held in position by the holding means;
   the printing means including a spatula-like squeegee, a screen, a first scraper means in the form of a spatula for scraping ink from the front surface of the screen remote from said board and a second scraper means in the form of a spatula for scraping ink from the rear surface of the screen adjacent said board;
   the holding means and the screen corresponding in size to a maximum squeegeeing size available with the apparatus, at least one of the holding means being vertically shiftable so as to correct the spacing therebetween for boards having varying vertical lengths, a dummy board being fittable between the holding means for compensating for the difference of a small-sized board from the maximum squeegeeing size in horizontal dimension, the dummy board having the same thickness as the small-sized board; and
   the first scraper means and the second scraper means being mechanically drivable at the same time to scrape the screen with the first scraper means positioned at a preset level with respect to the second scraper means, the squeegee being mechanically drivable for squeegeeing ink on the front surface of the screen after the first and second scraper means scrape the screen.

6. An apparatus as defined in claim 5 wherein the squeegee has a thickness of about 6 to about 10 mm, is projected from a support plate therefor by a length of about 20 to about 40 mm, has a Shore hardness of about 60 to about 90 HS and a squeegeeing ink angle with respect to the plane of the screen of about 60 to about 90 degrees and is set to a squeegeeing pressure of about 300 to about 1500 g/cm².

7. A screen printing apparatus for forming printed wiring on a board comprising:

a pair of holding means vertically opposed to each other for holding the board upright, and printing means arranged vertically adjacent to each surface of the board as held in position by the holding means, one of the holding means being stationary, the other holding means being connected to a pulling device and thereby adapted to be pulled in a direction away from the stationary holding means;

each of the holding means including a first clamp member in the form of a thin plate and a second clamp member in the form of a thin plate and lapped over and joined to the first clamp member to hold the end of the board between the members, the second clamp member being flexible at least at its forward end portion, the forward end portion being openable relative to the first clamp member, the opposed inner surfaces of the forward end portions of the first and second clamp members being separably adhered to each other with an adhesive;

the printing means including a spatula-like squeegee, a screen, a first scraper means in the form of a spatula for scraping ink from the front surface of the screen remote from the board and a second scraper means in the form of a spatula for scraping ink from the rear surface of the screen adjacent the board;

the first scraper means and the second scraper means being mechanically drivable at the same time to scrape the screen with the first scraper means positioned at a preset level with respect to the second scraper means, the squeegee being mechanically drivable for squeegeeing ink on the front surface of the screen after the first and second scraper means scrape the screen.

8. An apparatus as defined in claim 7 wherein the squeegee has a thickness of about 6 to about 10 mm, is projected from a support plate therefor by a length of about 20 to 40 mm, has a Shore hardness of about 60 to about 90 HS and a squeegeeing angle with respect to the plane of the screen of about 60 to about 90 degrees, and is set to a squeegeeing pressure of about 300 to about 1500 g/cm².

9. A screen printing apparatus for forming printed wiring on a board comprising:

means for holding the board upright at its upper end and lower end, and printing means arranged vertically adjacent to each surface of the board as held in position by the holding means, the holding means being in the form of a plate;

the printing means including a spatula-like squeegee, a screen, a first scraper means in the form of a spatula for scraping ink from the front surface of the screen remote from the board and a second scraper means in the form of a spatula for scraping ink from the rear surface of the screen adjacent the board;

the holding means and the board being elastic so as to be bent by the squeegeeing pressure when the board is held at its upper and lower ends by the holding means;

the first scraper means and the second scraper means being mechanically drivable at the same time to scrape the screen with the first scraper means positioned at a preset level with respect to the second scraper means, the squeegee being mechanically drivable for squeegeeing ink on the front surface of the screen after the first and second scraper means scrape the screen.

10. A screen printing method for forming printed wiring on a board having two surfaces, at least on surface having a screen in proximity thereto, comprising the steps of:

(a) scraping previously applied ink from the front surface remote from the board as positioned upright of the screen, by mechanically driving a spatula-like first scraper means;

(b) scraping previously applied ink from the rear surface of the screen adjacent the board during the scraping at a position about 10 to 20 mm above the first scraper means by mechanically driving a spatula-like second scraper means; and (c) thereafter mechanically driving a spatula-like squeegee on said front surface for squeegeeing ink on said screen against the board.

11. A method as defined in claim 10 wherein the squeegee is operated for squeegeeing with its longitudinal axis positioned obliquely with respect to the direction of advance of the squeegee, at an acute angle greater than about 80 degrees with a line along the direction of advance of the squeegee.

12. A method as defined in claim 10 wherein the first and second scraper means are in light pressing contact with the screen without bending while scraping the screen.

13. A method as defined in claim 10 wherein both surfaces of the board are screen-printed at the same time by performing said steps using screens disposed, respectively, in proximity with each surface of said board.

14. A screen printing method for forming printed wiring on a board having two surfaces, at least one surface having a screen in proximity thereto comprising the steps of:

(a) scraping previously applied ink from the front surface remote from the board as positioned upright of the screen, by mechanically driving a spatula-like first scraper means;

(b) scraping previously applied ink from the rear surface of the screen adjacent the board during the scraping at a position about 10 to about 20 mm below the first scraper means by mechanically driving a spatula-like second scraper means; and (c) thereafter mechanically driving a spatula-like squeegee on said front surface for squeegeeing ink on the screen against the board.

15. A method as defined in claim 14 wherein the squeegee is operated for squeegeeing with its longitudinal axis positioned obliquely with respect to the direction of advance of the squeegee, at an acute angle greater than about 80 degrees with a line along the direction of advance of the squeegee.

16. A method as defined in claim 14 wherein the first and second scraper means are in light pressing contact with the screen without bending while scraping the screen.

17. A method as defined in claim 14 wherein both surfaces or the board are screen-printed at the same time by performing said steps using screens disposed, respectively, in proximity with each surface of said board.

18. A screen printing method for forming printed wiring on a board having two surfaces, at least one surface having a screen in proximity thereto, comprising the steps of:

(a) scraping previously applied ink from the front surface remote from the board as positioned upright of the screen, by mechanically driving a spatula-like first scraper means;
(b) scraping previously applied ink from the rear surface of the screen adjacent the board during the scraping at the same level as the first scraper means by mechanically driving a spatula-like second scraper means; and
(c) thereafter mechanically driving a spatula-like squeegee on said front surface for squeegeeing ink on said screen against the board.

19. A method as defined in claim 18 wherein the squeegee is operated for squeegeeing with its longitudinal axis positioned obliquely with respect to the direction of advance of the squeegee, at an acute angle greater than about 80 degrees with a line along the direction of advance of the squeegee.

20. A method as defined in claim 18 wherein both surfaces of the board are screen-printed at the same time by performing said steps using screens disposed, respectively, in proximity with each surface of said board.

21. A screen printing method for forming printed wiring on a board having two surfaces, at least one surface having a screen in proximity thereto comprising the steps of:
(a) mechanically driving a spatula-like squeegee and a spatula-like first scraper means upward and downward along the front surface remote from the board as positioned upright of the screen, with the squeegee positioned a small distance below or above the first scraper, and mechanically driving a spatula-like second scraper means along the rear surface of the screen adjacent the board during the mechanical driving, to cause the first scraper means to scrape previously applied ink from the screen front surface and the second scraper means to scrape previously applied ink from the screen rear surface, with the squeegee positioned away from the screen, during the movement of the squeegee and the first and second scrapers in one of the upward and downward directions; and
(b) operating the squeegee for squeegeeing ink on the front surface of the screen, with the first and second scraper means positioned away from the screen, during the movement in the other direction after the scraping of the screen by the scraper means, the lower of the squeegee and the first scraper means during the downward movement being located in a range from a position about 1 mm away from the screen front surface to a position where the lower member is in contact with the screen front surface substantially without exerting any pressure on the screen.

22. A method as defined in claim 21 wherein the squeegee is operated for squeegeeing with its longitudinal axis positioned obliquely with respect to the direction of advance of the squeegee, at an acute angle greater than about 80 degrees with a line along the direction of advance of the squeegee.

23. A method as defined in claim 21 wherein both surfaces of the board are screen-printed at the same time by performing said steps using screens disposed, respectively, in proximity with each surface of said board.

* * * * *